United States Patent
Hung et al.

(10) Patent No.: US 6,855,599 B2
(45) Date of Patent: Feb. 15, 2005

(54) FABRICATION METHOD OF A FLASH MEMORY DEVICE

(75) Inventors: Chih-Wei Hung, Hsin-chu (TW); Da Sung, Hsinchu (TW); Chih-Ming Chen, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/707,668

(22) Filed: Dec. 31, 2003

(65) Prior Publication Data

US 2004/0121536 A1 Jun. 24, 2004

Related U.S. Application Data

(62) Division of application No. 10/065,554, filed on Oct. 30, 2002, now Pat. No. 6,730,959.

(51) Int. Cl.[7] .............................................. H01L 21/336
(52) U.S. Cl. ........................ 438/257; 438/223; 438/233
(58) Field of Search .......................................... 438/257

(56) References Cited

U.S. PATENT DOCUMENTS 6,214,668 B1 * 4/2001 Hsu et al. .................. 438/257

* cited by examiner

Primary Examiner—David Nelms
Assistant Examiner—Thao P. Le
(74) Attorney, Agent, or Firm—Jianq Chyun IP Office

(57) ABSTRACT

A flash memory device includes a substrate having a trench, a deep N-type well region in the substrate, a stacked gate structure on the substrate, a first and a second spacer on a sidewall of the stacked gate, wherein the first spacer is connected with the top of the trench, a source region in the substrate under the first spacer, a drain region in the substrate under the second spacer, a P-type well region between the stacked gate and the deep N-type well region, wherein the junction between the two well regions is higher than the bottom of the trench, a doped region along the bottom and the sidewall of the trench, wherein this doped region is connected with the source region and isolates the P-type well region from the contact formed in the trench, the contact being electrically connected to the source region.

10 Claims, 9 Drawing Sheets

FABRICATION METHOD OF A FLASH MEMORY DEVICE

CROSS REFERENCE TO RELATED APPLICATIONS

This application is a divisional application of, and claims the priority benefit of, U.S. application Ser. No. 10/065,554 filed Oct. 30, 2002 now U.S. Pat. No. 6,730,959.

BACKGROUND OF INVENTION

1. Field of the Invention

The present invention relates to a structure of a non-volatile memory device and a method for fabricating the same. More particularly, the present invention relates to a structure of a flash memory device method and a method for fabricating thereof.

2. Description of Related Art

A flash memory device provides the property of multiple entries, retrievals and erasures of data. Moreover, the stored information is retained even electrical power is interrupted. As a result, the non-volatile memory device is widely used in personal computers and electronic systems.

A typical flash memory device employs doped polysilicon for the formation of the floating gate and the control gate. During the programming and the erasing of this type of flash memory device, an appropriate voltage is applied to the source region, the drain region and the control gate to inject electrons into and to eject electrons from the polysilicon floating gate.

In general, electron injection for a flash memory device includes the channel hot-electron injection (CHEI) model and the Fowler-Nordheim Tunneling model. The programming and the erasing of a device are accomplished by either the injection or ejection of electrons.

Referring to FIG. 1, FIG. 1 is a schematic diagram, illustrating the structure of a conventional stacked gate flash memory (U.S. Pat. No. 6,214,668). A conventional flash memory device is formed with a p-type substrate 100, a deep N-type well region 102, a P-type well region 104, a stacked gate structure 106, a source region 108, a drain region 110, a spacer 112, an inter-layer dielectric layer 114, a contact 116 and a conductive line 118. The stacked gate structure 106 comprises a tunnel oxide layer 120 a floating gate 122, a gate dielectric layer 124, a control gate 126 and a gate cap layer 128. The deep N-type well 102 is located in the P-type substrate 100. The stacked gate structure 106 is disposed on the substrate 100. The source region 108 and the drain region 110 are located beside the aides of the stacked gate structure 106 in the P-type substrate 100. The spacer 112 is disposed on the sidewall of the stacked gate structure 106. The P-type well region 104 is located in the N-type deep well region 102, extending from the drain region 110 to substrate 100 underneath the stacked gate structure 106. The interlayer dielectric layer 114 is disposed on the P-type substrate 100. The contact 116 penetrates through the inter-layer dielectric layer 114 and the substrate 100, short-circuiting the P-type well region 104 and the drain region 110. The conductive line 118 is disposed above the interlayer dielectric layer 114 and electrically connected with the contact 116.

During the fabrication of the flash memory device illustrated in FIG. 1, the P-type well region 104 formed by forming a music layer (not shown) on the entire P-type substrate 100 subsequent to the formation of the stacked gate structure 106. This mask layer exposes a predetermined region for forming the drain region. A tilt angle (0 degrees to 180 degrees) ion implantation process is then conducted to implant dopants to the deep N-type well region 102 in the P-type substrate 100 near the drain region on one side of the stacked gate structure 100, using the stacked gate structure 106 and the mask layer as a mask. A drive-in process is then performed to extend the P-type well region 104 to the substrate 100 under the stacked gate structure 106.

During the formation of the stacked gate structure, the silicon oxide etching rate is normally increased to completely remove the grid-shaped gate dielectric layer in order to prevent the gate dielectric layer debris remaining on the sidewall of the floating gate. The field oxide layer, not covered by the floating gate layer, is then over-etched to form a trench. Consequently, dopants that are implanted during the tilt angle ion implantation process (30 to 50 electronic volts of implantation energy) for the formation of the P-type well region 104 would penetrate through the field oxide layer, inducing a current leakage of the memory cell at the side of the drain region. Further, an ineffective isolation between the bit lines is resulted.

Additionally, to form the local P-well region, the subsequent dopant drive-in process is conducted under a temperature of 900 degrees Celsius and an oxygen gas ambient. The tunnel oxide layer along the edge of the floating gate 122 and the gate dielectric layer 124 (silicon oxide/silicon nitride/silicon oxide) would become thicker. Further, the diffusion of the P-well driving-in is difficult to control. The efficiency and the yield of the device are adversely affected.

Further, the source regions of the flash memory devices is connected together through the deep N-type well region to form a source line. Since the resistance of a deep N-type well region is higher, the operational speed is affected. In order to increase the operational speed, a source line pickup is conventionally formed at every 16 memory cells in the active region, in other words, 16 bit lines, to lower the resistance of the deep N-type well region (source line). However, forming a source line pickup in the active region would lower the ration of the memory cell array. The integration of the device thereby can not be increased.

Further, during the formation of the contact 116, the interlayer dielectric layer 114 and the P-type substrate 100 are etched to form a contact that penetrates through the interlayer dielectric layer 114 and the drain region 110. The aspect ratio of the contact is thus very high. Moreover, two different materials (silicon oxide and silicon) are etched. Controlling the depth of the contact is thus very difficult. The difficulty of the manufacturing process is thereby increased. Also, during the back-end processing, the contact of the memory cell region and the contact of the periphery circuit region need to be separated. The back-end processing thus becomes more complicated.

SUMMARY OF INVENTION

Accordingly, the present invention provides a structure of a flash memory device and a fabrication method for the same, wherein forming an additional source line pickup is obviated while the reliability of the device is increased. Moreover, the problem of current leakage between contiguous bit lines is resolved and the integration of the memory device is increased.

The present invention further provides a structure of a flash memory device and a fabrication method for the same, wherein the number of the manufacturing steps is reduced to increase the margin of the manufacturing process, and to reduce the cost and the time.

The present invention provides a structure of a flash memory device, wherein this flash memory device comprises a first conductive type substrate that already comprises a trench, a second conductive first well region located in the first conductive type substrate, a stacked gate structure disposed on the first conductive type substrate, a first spacer and a second spacer disposed on the sidewall of the stacked gate structure, wherein the top of the trench and the first spacer is connected. The flash memory device of the present invention further comprises a source region in the first conductive type substrate under the first spacer, a drain region in the first conductive type substrate under the second spacer, a first conductive type second well region disposed between the stacked gate structure and the second conductive type first well region, wherein the junction between the first conductive type second well region and the second conductive first well region is higher than the bottom of the trench. Additionally, a doped region is disposed on the sidewall and the bottom of the trench, wherein this doped region electrically connects with the source region. A first contact that fills the trench in the first conductive type substrate, wherein the doped region isolates the first contact from the first conductive type second well region. Further, the drain region and the first conductive second well region are electrically short-circuited through a second contact.

The source region of the present invention is located in the substrate under the spacer. Moreover, the source region is connected to the doped region at the sidewall and the bottom of the trench. This doped region can isolate the P-type well region to prevent a short-circuited between the source region and the P-type well region subsequent to the formation of the contact. Moreover, the contact (tungsten source line) connects the source region of each memory cell to reduce the resistance of the source line without forming an additional source line pickup in the active region. The integration of the device can thus increase.

Moreover, the trench of the present invention segments the P-type well region to form a P-type well region only between the source regions of two neighboring memory cells. Accordingly, a current leakage at the drain region of the memory cell due to the penetration of the implanted dopants through the field oxide layer is prevented. The problem of an ineffective isolation between bit lines is also avoided. Further, the tunnel oxide layer and the gate oxide layer (silicon oxide/silicon nitride/silicon oxide) is prevented from becoming thicker along the edge of the stacked gate structure due to the driving-in for isolating the p-type well region. The efficiency and the yield of the device can thereby maintain.

Further, the contact of the present invention is formed by directly forming a conductive layer on the substrate, followed by back-etching or chemical mechanical polishing a portion of the conductive layer until the gate cap layer is exposed. Since the interlayer dielectric layer and the P-type substrate are not etched to form the contact that goes through the interlayer dielectric layer and the drain region, the margin for contact process can thus increase.

The present invention provides a fabrication method for a flash memory device, the method comprising forming a second conductive type first well region, a first conductive type second well region in the substrate and a stacked gate structure on the substrate. A source region and a drain region are formed in the substrate beside two sides of the stacked gate structure. A spacer is formed on the sidewall of the stacked gate structure. A first patterned photoresist layer is then formed on the substrate, wherein the patterned photoresist layer exposes the substrate at the drain region. Using the patterned first photoresist layer and the gate structure with a spacer as a mask, the substrate at the drain region is etched through the junction between the drain region and the first conductive type second well region. The first patterned photoresist layer is then removed. A second patterned photoresist layer is then formed on the substrate, wherein the second patterned photoresist layer exposes the substrate at the source region. Using the second patterned photoresist layer and the stacked gate structure with the spacer as a mask, the source region at the substrate is etched to form a trench in the second conductive type first well region. An ion implantation process is then conducted to implant dopants to the substrate to form a doped region at the sidewall and the bottom of the trench. The second patterned photoresist layer is then removed. Thereafter, a first conductive layer is then formed on the substrate, wherein the first conductive layer fills the gap between the stacked gate structure. A portion of the first conductive layer is then removed to form a first contact on the source region and a second conductive layer on the first conductive type second well region, wherein the first contact is electrically connected with the source region and the doped region. The second conductive layer is then patterned to form a second contact, wherein the first conductive second well region and the drain region are short-circuited by the second contact. An interlayer dielectric layer is formed on the substrate, and a conductive line is formed on the interlayer dielectric layer, electrically connecting with the second contact.

The present invention employs a photoresist layer to cover the source region. The substrate at the drain region is then etched such that the subsequently formed contact penetrates through the junction between the drain region and the P-type well region and short-circuit the drain region and the P-type well region. Another patterned photoresist layer is then formed to cover the drain region, the substrate at the source region is then etched until trench is formed in the deep N-type well region, wherein this trench segments through the P-type well region to form a P-type well region only in between the source regions of two neighboring memory cells. Thereafter, an ion implantation process is conducted to form a doped region at the sidewall and the bottom of the trench. This doped region isolates the P-type well region and the subsequently formed contact, preventing a short circuit between the P-type well region and the contact. A contact (tungsten source line) is then formed in the trench to electrically connect the source region of every memory cell. The resistance of the source line is thus lower. Further, it is not necessary to form an additional source line pickup in the active region and the integration of the device is increased.

Accordingly, the present invention forms a trench by etching the substrate to the deep N-type well region, wherein this trench segments through the P-type well region. This P-type well region is then located only between the source regions of two neighboring memory cells. Since the P-type well region of the present invention is not formed by the conventional tilt angel (0 degree to 180 degrees tilt angle) ion implantation process and the dopant drive-in process. A current leakage at the drain region of the memory cell due to a penetration of the implanted dopants through the field oxide layer is prevented. The problem of an ineffective isolation between the field oxide layer is also avoided. Further, the formation of an oxide layer along the border of the stacked gate structure is prevented to better maintain the efficiency and yield of the memory cell device.

Further, during the formation of the contact in the present invention, a conductive layer is formed directly on the substrate, followed by back-etching or chemical mechanical polishing a portion of the conductive layer until the gate cap layer is exposed. Therefore, the interlayer dielectric layer and the p-type substrate are not etched while the contact is formed through the junction between the interlayer dielectric layer and the drain region. The margin for contact processing is thus increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
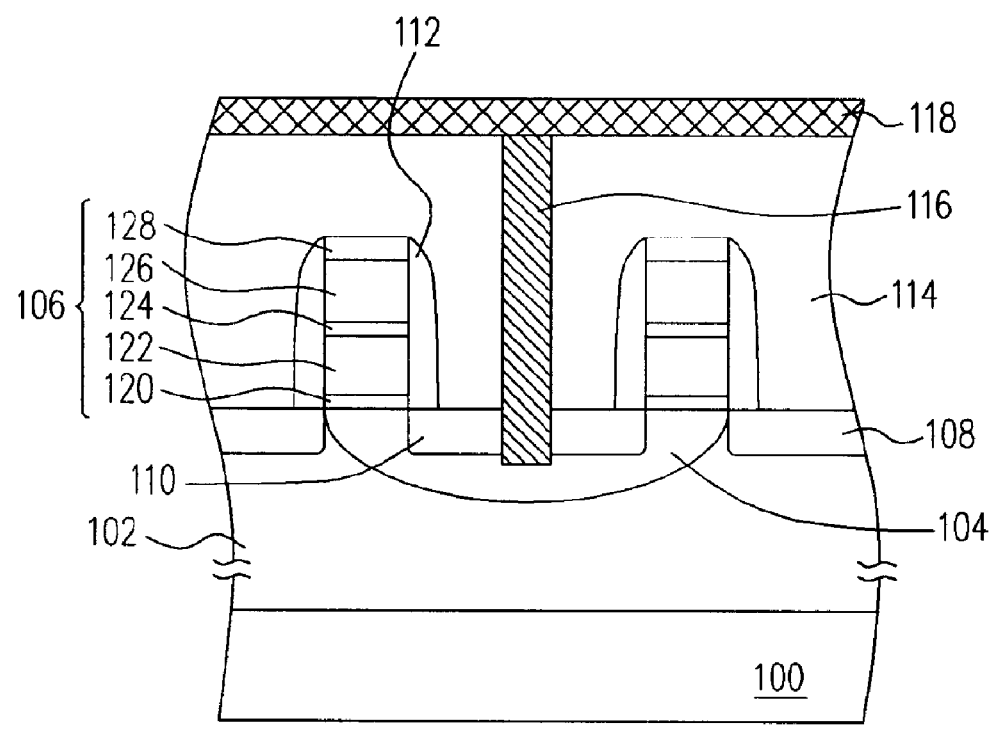
FIG. 1 is a structure of a conventional flash memory device.
Figure 2:
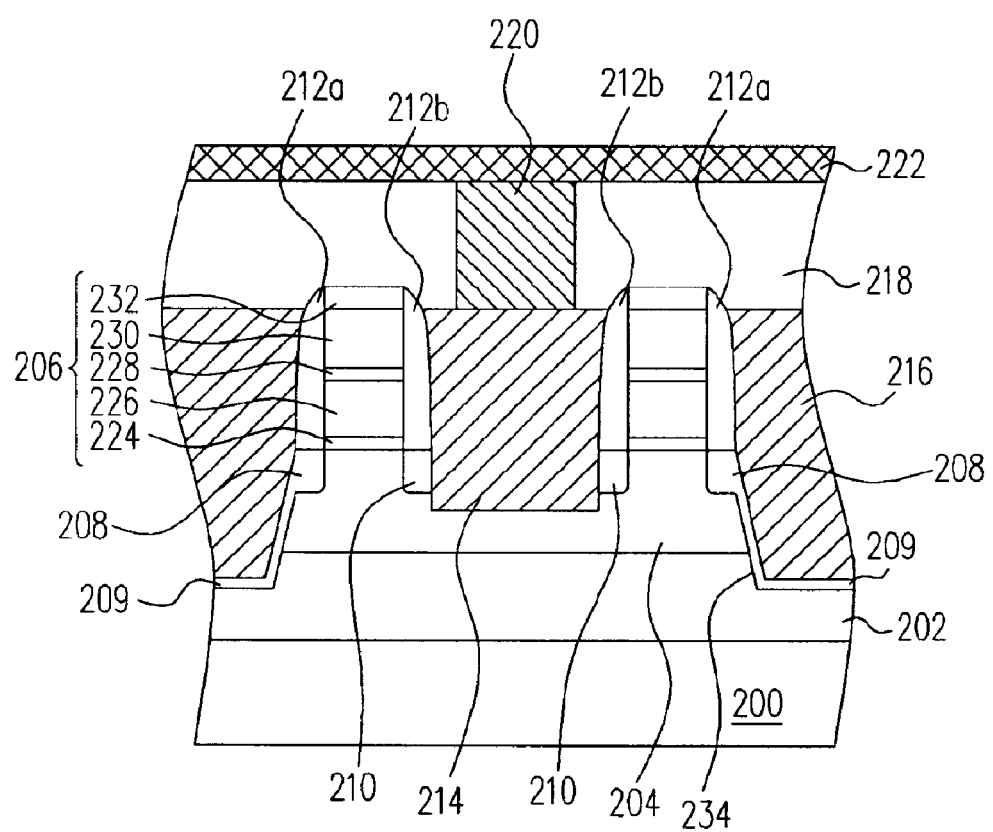
FIG. 2 is a cross-sectional view of a structure of a flash memory device according to an embodiment of the present invention.

FIG. 2 is a cross-sectional view of a structure of a flash memory device according to an embodiment of the present invention. A BiNOR type of array flash memory device is used as an example to illustrate the features of the present invention.

Referring to FIG. 2, the flash memory device of the present invention is formed with a P-type substrate 200, a deep N-type well region 202, a P-type well region 204, a stacked gate structure 206, a source region 208, a doped region 209, a drain region 210, a spacer 212a, a spacer 212b, a contact window 214, a contact window 216, an interlayer dielectric layer 218, a plug 220 and a conductive line 222. The stacked gated structure 206 is formed with a tunnel oxide layer 224, a floating gate 226, a gate dielectric layer 228, a control gate 230 and a gate cap layer 232.

The P-type substrate 200 comprises a trench 234. The deep N-type well region 202 is located in the P-type substrate. The spacer 212a and the spacer 212b are disposed on the sidewall of the stacked gate structure 206, wherein the spacer 212a is directly connected to the top of the trench 234. The source region 208 si located in the P-type substrate 200 under the spacer 212a, while the drain region is located in the P-type substrate 200 under the spacer 212b. A P-type well is located between the deep N-type well region 202 and the stacked gate structure 206, wherein the junction between the P-type well region 204 and the deep N-type well region 202 higher than the bottom of the trench 234. A doped region is located on the sidewall and the bottom of the trench 234. The doped region 209 is connected to the source region 208, wherein the doped region isolates the p-type well region from the subsequently formed contact 216. The contact 214 penetrates the junction between the drain region 210 and the p-type well region 204, short-circuiting the drain region 210 and the p-type well region 204. The contact 216 fills the trench in the p-type substrate and electrically connects with the source region 208. The interlayer dielectric layer 213 is disposed above the P-type substrate 200. A plug 220 is disposed in the interlayer dielectric layer 218, electrically connecting to the contact 214. A conductive line 222 is disposed on the interlayer dielectric layer 218, electrically connecting to the plug 220.

According to the above embodiment of the present invention, the source region 208 is located in the substrate 200 under the spacer 212a and is connected to the doped region 209 at the sidewall and the bottom of the trench 234. This doped region 209 can prevent an electrical short between the subsequently formed contact 216 and the p-well region 204. Further the contact 216 (tungsten source line) connects the source region 208 of each memory cell to lower the resistance of the source line without the formation of a source line pickup in the active region. The integration of the device is also increased.

Further, the trench 234 segments the P-type well region 204. The P-type well region 204 is thereby only located in between the source regions of two neighboring memory cells. The present invention can prevent the penetration of dopants through the field oxide layer in order to create the isolated p-well. A current leakage at the side of the drain region of a memory cell and an ineffective isolation between bit lines are thereby prevented. Further, the formation of an oxide material along the border of the stacked gate structure is prevented to maintain the efficiency and the yield of the memory cell device.

Additionally, the contact 214 and the contact 216 are formed by directly forming a conductive layer on the substrate 200, followed by performing a back-etching process or a chemical mechanical polishing process to remove a portion of the conductive layer until the gate cap layer is exposed. Since the contact is formed penetrating through the interlayer dielectric layer and the drain region, the interlayer dielectric layer and the P-type substrate are prevented from being etched to increase the margin of the contact manufacturing process.

Continuing to FIGS. 3A to 3G, FIGS. 3A to 3G are schematic, perspective views illustrating the process flow for fabricating a flash memory device of an embodiment of the present invention.

Figure 3A:
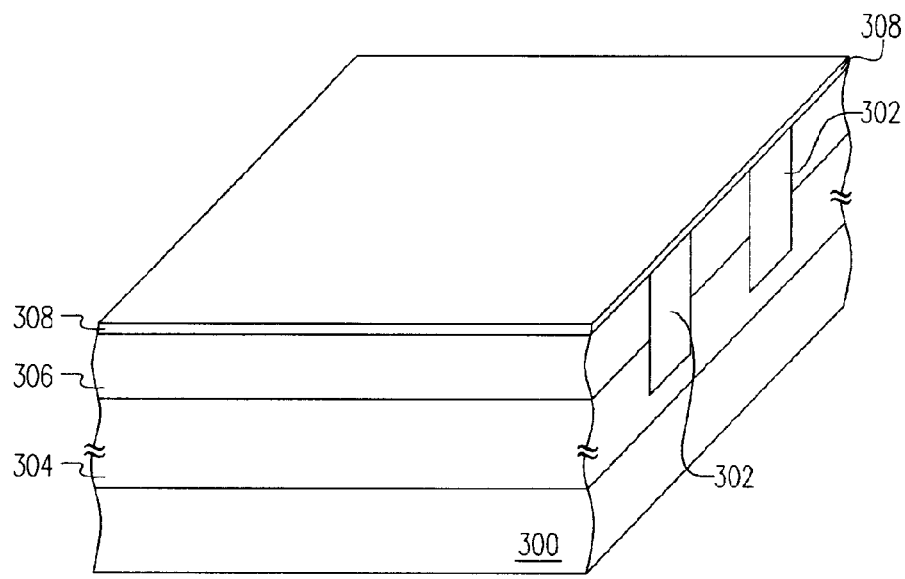
FIGS. 3A to 3H are schematic, perspective views illustrating the process flow for fabricating a flash memory device.

Referring to FIG. 3A, a P-type substrate 300 is provided, wherein this P-type substrate 300 is already completed with device isolation structures 302. The device isolation structures 302 are arranged in stripes to define the active region. The isolation structures 302 are formed by, for example, local oxidation (LOCOS) or shallow trench isolation (STI). Thereafter, a deep N-type well region 304 is formed in the P-type substrate 300, and a P-type well region 306 is formed in the deep N-type well region 304. Forming the P-type well region 306 includes implanting ions, such as, boron ions, with an implantation energy of about 50000 volts. Thereafter, an oxide layer 308 is formed as a tunnel oxide layer on the surface of the P-type substrate 300. The oxide layer 308 is formed by, for example, thermal oxidation, to a thickness of about 90 angstroms to about 100 angstroms. Using the thermal oxidation method to form the oxide layer 308 can also drive-in dopants in the p-type well region 306.

Figure 3B:
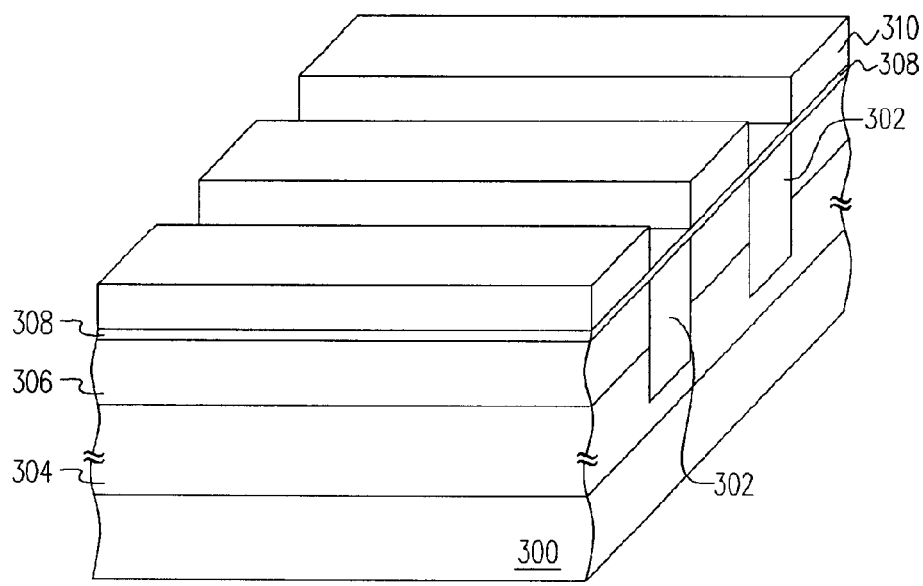

Referring to FIG. 3B, a conductive layer (not shown) is formed on the oxide layer 308. The conductive layer includes a doped polysilicon type of material, wherein this conductive layer is formed by, for example, performing a chemical vapor deposition to form an undoped polysilicon layer, followed by performing an ion implantation process. Further, this conductive layer is about 800 angstroms thick. This conductive layer is then patterned to form the conductive layer 310, as shown in FIG. 3B, exposing the isolation structures 302 of the device.

Figure 3C:
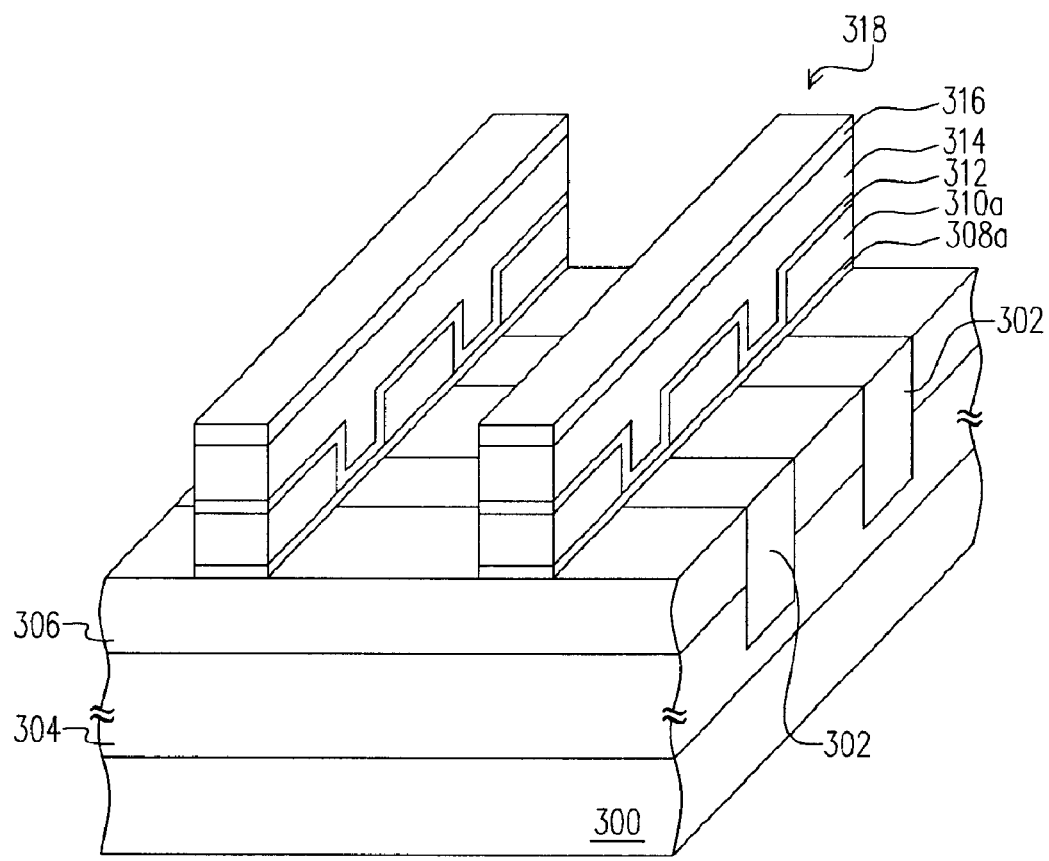

As shown in FIG. 3C, a dielectric layer (not shown), a conductive layer (not shown) and a cap layer (not shown) are sequentially formed on the substrate 300. Using a mask, the cap layer and the conductive layer are patterned to define a gate cap layer 316 and a conductive layer for the control gate. During the definition of the conductive layer 314, the dielectric layer, conductive layer 310 and the oxide layer 308 are also being defined to form the dielectric layer 312, the conductive layer 310a and the oxide layer 308a, wherein the conductive layer 310a serves as the floating gate. In other words, the stacked gate structure 318 of the flash memory device is formed with the stacked structure of the gate cap layer 316, conductive layer (control gate) 314, the dielectric layer 312, the conductive layer (floating gate) 310a and the oxide layer 308a (tunnel oxide layer).

The dielectric layer 312 includes, for example, a silicon oxide/silicon nitride/silicon oxide type of material. The dielectric layer 312 is formed by, for example, low pressure chemical vapor deposition. The dielectric layer 312 can be a material, such as, silicon oxide, silicon oxide/silion nitride.

The conductive layer 314, includes doped polysilicon, with a thickness of about 2000 angstroms. The conductive layer 314 is formed by, for example, in-situ ion implantation by means of chemical vapor deposition.

The gate cap layer 316 includes a material, such as, silicon nitride or silicon oxide. The gate cap layer 316 is about 1500 angstroms thick and is formed by a method, such as, chemical vapor deposition.

Figure 3D:
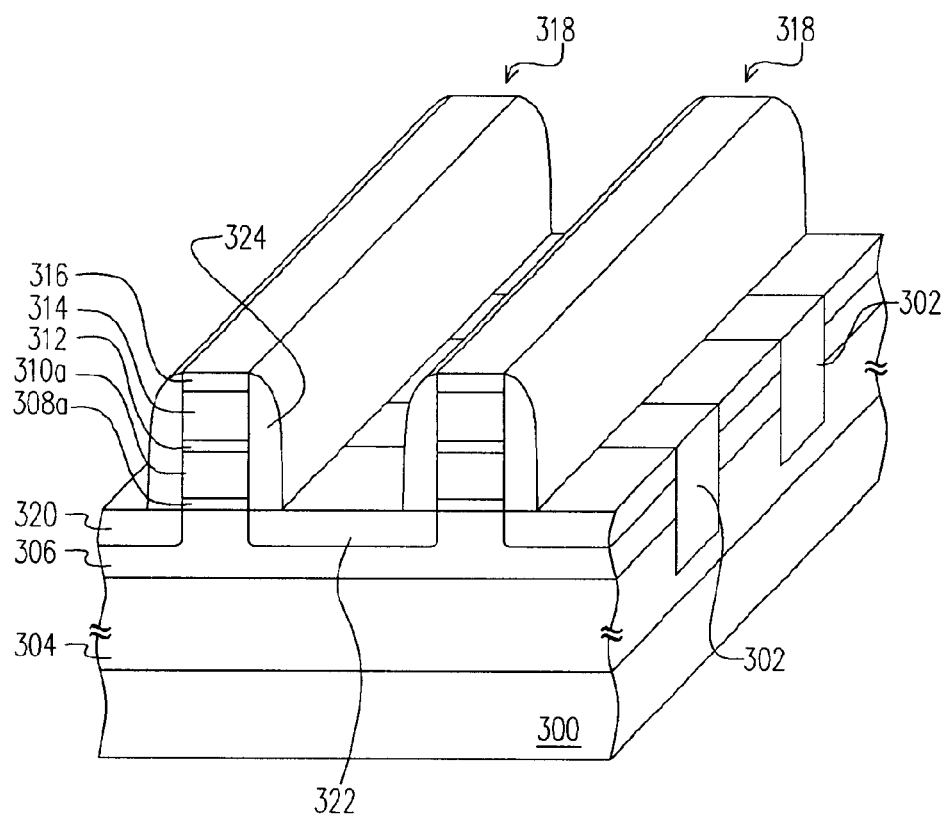

Continuing to FIG. 3D, using the stacked gate structure 318 as a mask, an ion implantation process is conducted to implant dopants to the substrate 300 on the sides of the stacked gate structure 318 to form the source region 320 and the drain region 322. The implanted dopants include N-type dopants, such as, arsenic ions or phosphorous ions. Thereafter, a spacer 324 is formed on the sidewall of the stacked gate structure 318. The spacer 324 is formed by, for example, forming an insulation layer (not shown), such as, a silicon nitride layer or a silicon oxide layer, followed by performing an anisotropic etching to remove a portion of the insulation layer to form the spacer 324 on the sidewll of the stacked gate structure 318.

Figure 3E:
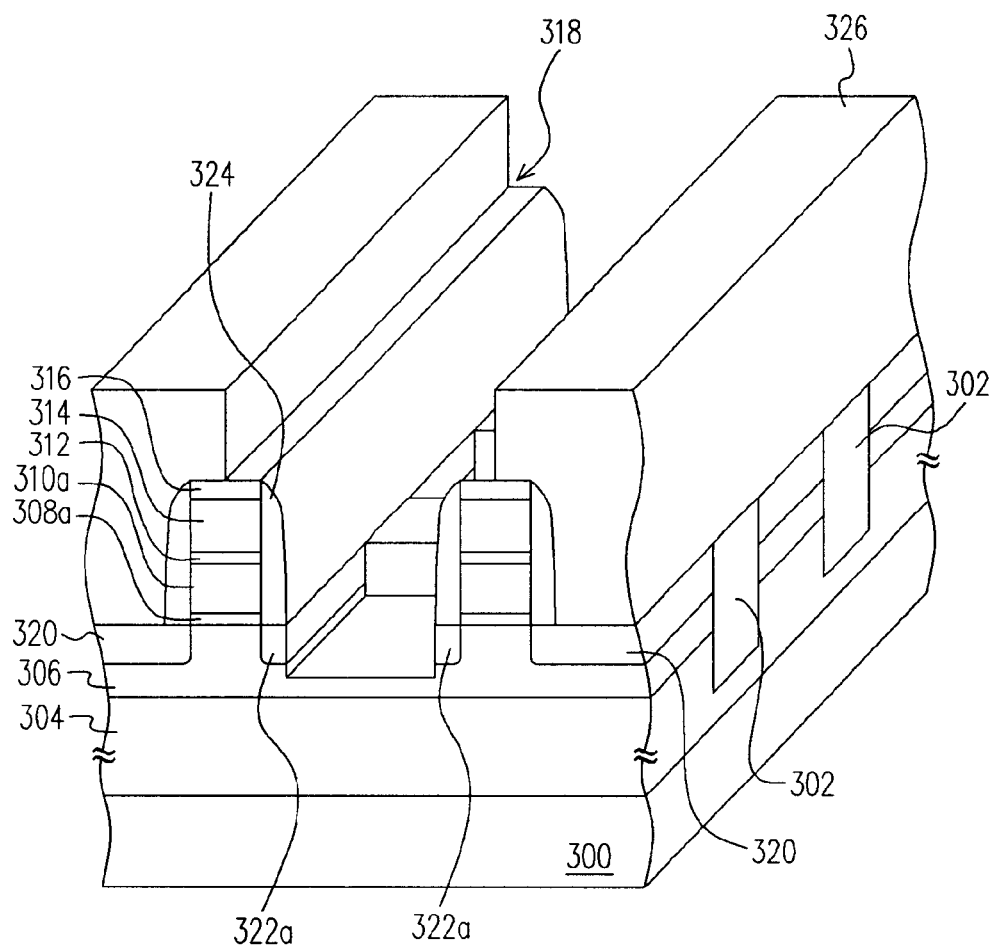

Continuing to FIG. 3E, a patterned photoresist layer 326 is then formed on the entire substrate 300, wherein this patterned photoresist layer 326 exposes the drain region 322. Thereafter, an etching process is performed to etch the substrate 300 until the P-type well region and the drain region 322a are exposed, using the patterned photoresist layer 326 and the stacked gate structure 318 with the spacer 326 as a mask. The drain region 322a is positioned under the spacer. Therefore, the subsequently formed contact would penetrate through the junction between the drain region 322a and the P-type well region 306, short-circuiting the drain region 322a and the P-type well region 306. Subsequently, the patterned photoresist layer 326 is removed.

Figure 3F:
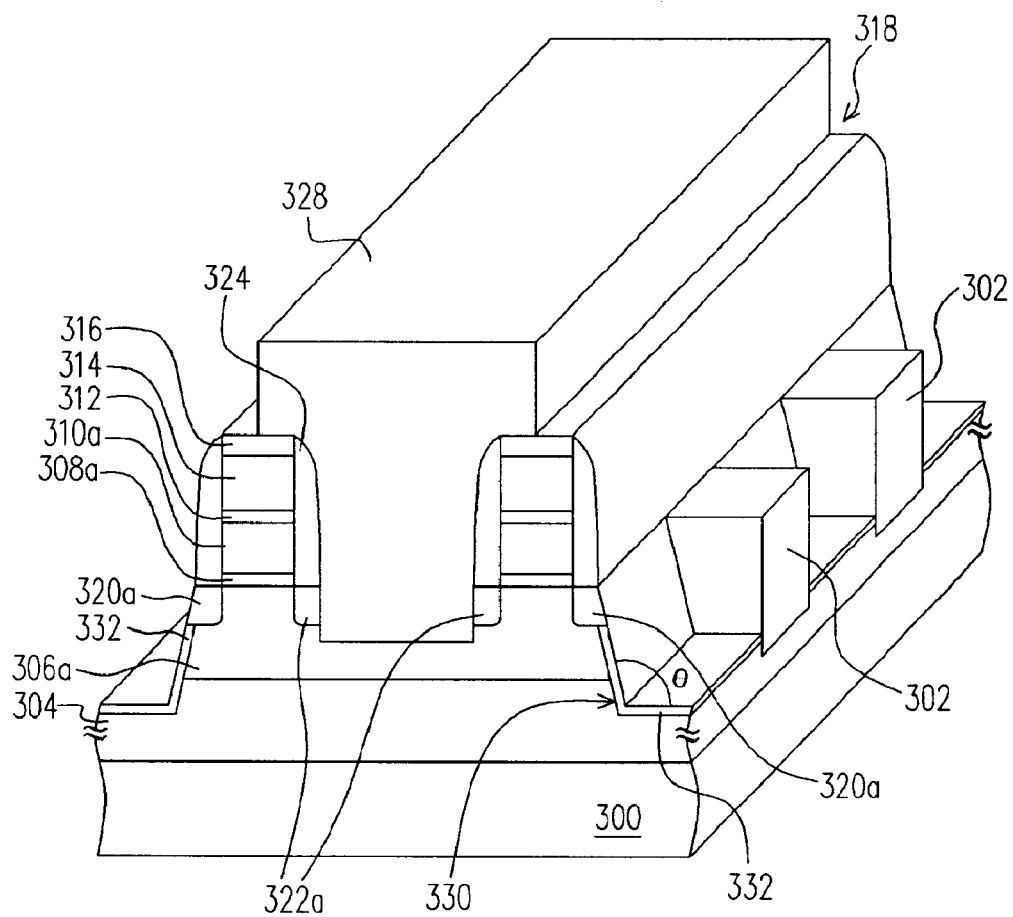
Figure 3G:
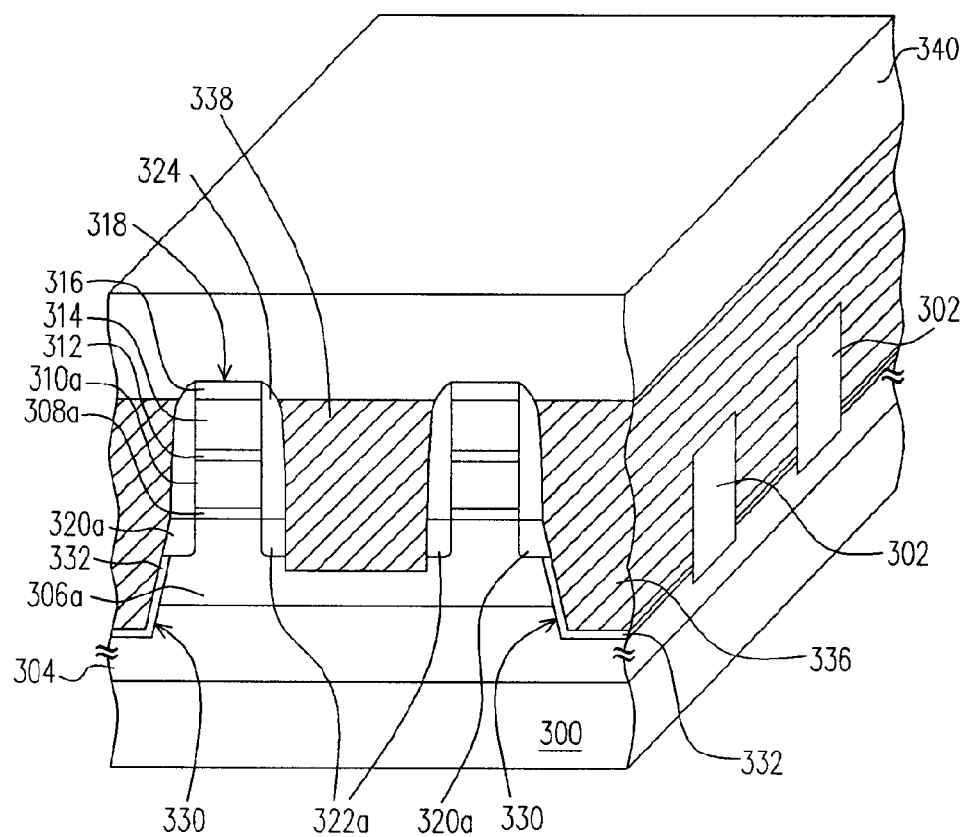

Referring to FIG. 3F, a patterned photoresist layer 328 is formed on the entire substrate 300. This patterned photoresist layer 328 exposes the source region 320. An etching is then conducted using the patterned mask layer 328 and the stacked gate structure 318 as a mask, wherein the substrate 300 is etched into the N-type well region 304 to farm a trench 330 and a source region 320a, wherein the source region 320a is located under the spacer 324. The bottom of the trench 330 and the sidewall of the trench 330 form an obtuse angle θ. Further, the trench 300 segments the P-type well region 306 to form the P-type well region 306a, wherein this P-type well region 306a is formed between the source regions 320a of two neighboring memory cells. An ion implantation process is then conducted to implant dopants to the substrate 300 along the sidewall and the bottom of the trench 330 to form a doped region 332, using the stacked gate structure 318 and the patterned photoresist layer 328 as a mask. The implanted dopants include, for example, N-type dopants, such as, arsenic ions or phosphorous ions. If the implanted dopants are arsenic ions, the implantation energy is about 60000 volts and the implanted dosage is about $1 \times 10^{15}$ atoms/cm². If the implanted dopants are phosphorous ions, the implantation energy is about 30000 volts and the implanted dosage is about $1 \times 10^{15}$ atoms/cm². The dopants are implanted with a method includes the tilt angle implantation at a tilt angle of, for example, 15 degrees to 30 degrees. The doped region 332 can isolate the subsequently formed contact from the P-type well region 306a to prevent a short-circuit between the contact and the P-type well region 306a. Thereafter, the patterned photoresist layer 328 is removed. Referring to FIG. 3G, a contact 336 (source line) is formed above the source region 320a between the gate structures 318 and a contact 338 is formed on the P-type well region 306a between the gate structures 318. The contact (source line) 336 and the contact 338 are formed with, for example, tungsten. The contact 336 (scarce line) and the contact 338 are formed by, for example, forming a conductive layer (not shown) on the substrate 300 and this conductive layer fills the space between the gate structures 318. A chemical mechanical polishing or back-etching process is then performed until the cap layer 316 or the gate is exposed to form the contact 336 (source line) on the source region 320s between the gate structures 318 and the conductive layer(not shown) on the P-type well region 306a between the gate structures 318. The conductive layer (not shown) is, for example, a strip of conductive layer, approximately parallel to the contact 336. A photolithography and etching are performed to remove a portion of the conductive layer to form an opening so the conductive layer (not shown). This opening isolates the contact 338 of neighboring memory cells. The contact 338 penetrates to the junction between the drain region 322a and the P-type well region 306 to electrically short-circuit the drain region 322a sod the P-type well region 306.

An interlayer dielectric layer 340 is formed on the substrate 300. This interlayer dielectric layer 340 fills the aforementioned opening formed in the conductive layer (not shown in FIG. 3G). The interlayer dielectric layer 340 includes Boro-Phospho-Silicate Glass (BPSG) and Phospho-Silicate Glass (PSG) by, for example, chemical vapor deposition. A chemical mechanical polishing is then conducted to planarize the surface of the interlayer dielectric layer.

Figure 3H:
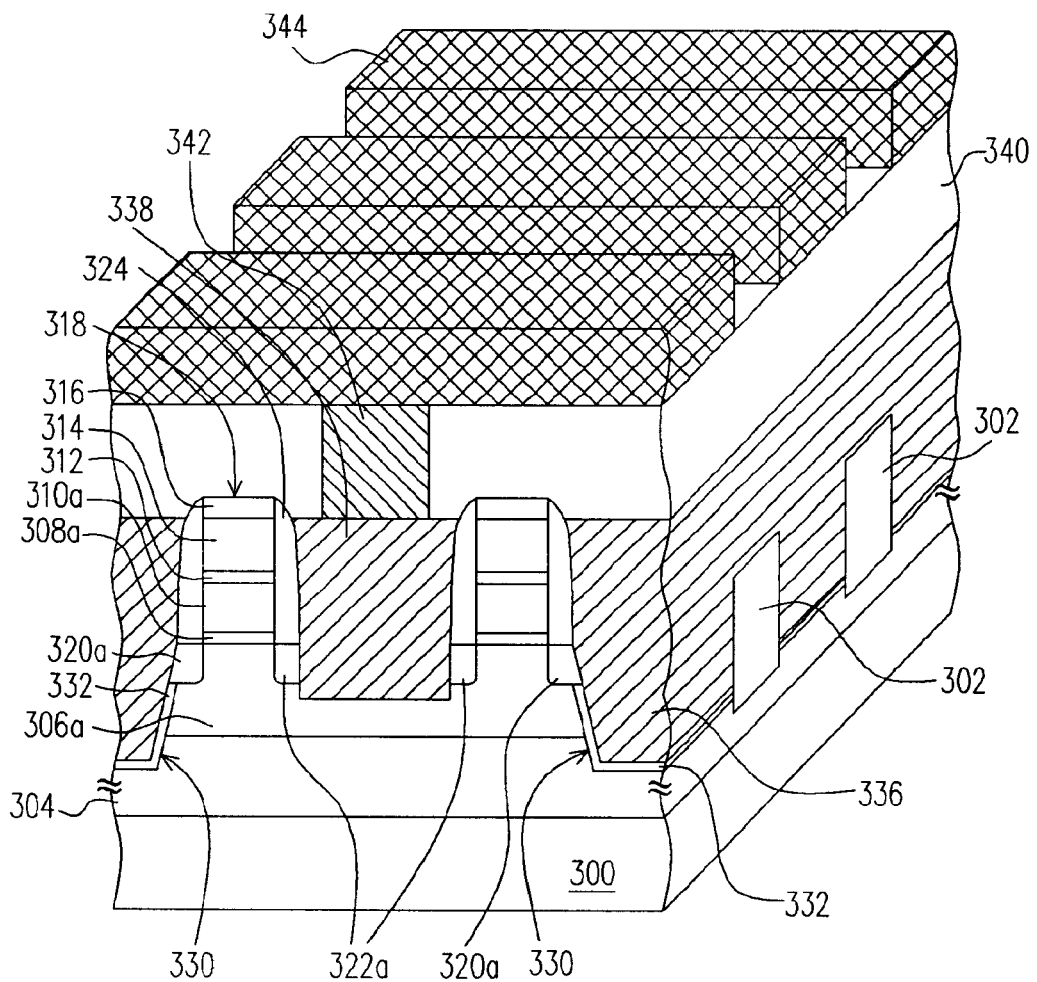

Referring to FIG. 3H, a plug 342 is formed in the interlayer dielectric layer 340 to electrically connect with the contact 338. The plug 342 is, for example, made from a tungsten material, and is formed by, for example, forming an opening (not shown) that exposes the contact 338 in the interlayer dielectric layer 340, followed by filling the opening with a conductive material. Thereafter, a conductive line 344 (bit line) is formed on the interlayer dielectric layer to electrically connect with the plug 342. Forming the conductive line 344 includes forming a conductive layer (now shown) on the substrate, followed by performing a photolithography and etching to form the bar shaped conductive lines 344 (bit line). The subsequent manufacturing process is well known to those skilled in the art and will be not be further reiterate here.

According to the present invention, the source region 320a is formed in the substrate 300 under the spacer 324 and is connected to the doped region 332 along the sidewall and bottom of the trench. This doped region 332 isolates the P-type well region 306a from the subsequently formed contact 336 to prevent a short-circuit between the P-type well region 306a and the contact 336. Further, the contact (tungsten source line) connects the source region of every memory cell to lower the resistance of the source line without forming an additional source line pickup in the active region. The integration of the device thus also increases.

Additionally, in the present invention, the substrate 300 is etched to the N-type well region 304 to form the trench 330. The trench 330 segments the P-type well region to form the P-type well region 306a, wherein the P-type well region 306a is positioned between the source regions 320a of the two neighboring memory cells. Since the P-type well region of the present invention does not apply the conventional tilt angel (0 degree to 180 degrees tilt angle) ion implantation process and the dopants drive-in process. The problems of a current leakage of the memory cell at the side of the drain region and an ineffective isolation between the bit lines are prevented. Further, an oxide material will not form along the border of the stacked gate structure to maintain the effectiveness and yield of the device.

Moreover, during the formation of the contact 336 and the contact 338, a conductive layer is formed directly on the substrate 300, followed by performing a back-etching or a chemical mechanical polishing to remove a portion of the conductive layer until the gate cap layer 316 is exposed. Since the etching of the interlayer dielectric layer and the P-type substrate to form a contact opening that penetrates through the interlayer dielectric layer and the drain region is prevented. The margin for contact processing is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a flash memory device, comprising:

providing a first conductive type substrate, wherein the substrate comprises a second conductive type first well region, a first conductive type second well region which is formed in and shallower than the second conductive type first well and at least a pair of stacked gate structures which are sequentially formed thereon, wherein a gap is located between the pair of stacked gate structures;

forming source/drain regions in the substrate beside two sides of the stacked gate structures, wherein a first source/drain region is below the gap and a pair of second source/drain regions is outside the stacked gate structures;

forming a plurality of spacers on sidewalls of the stacked gate structures;

forming a first patterned photoresist layer on the substrate, the first patterned photoresist layer exposes the gap;

etching the substrate until penetrating through a junction between the first source/drain region and the first conductive type second well region to form a first trench by using the first patterned photoresist layer and the stacked gate structures with the spacer as masks;

removing the first patterned photoresist layer;

forming a second patterned photoresist layer on the substrate, the second patterned photoresist layer exposes a portion of the substrate outside the stacked gate structure;

etching the portion of the substrate to the second conductive type first well region to form a pair of second trenches by using the second patterned photoresist layer and the stacked gate structures with the spacers as masks;

performing an ion implantation process to implant dopants into bottoms and sidewalls of the second trenches to form a pair of doped regions;

removing the second patterned photoresist layer;

forming a first contact plug in the first trench and to form a pair of second contact plugs in the second trenches, wherein the first contact plug electrically short the first source/drain region below the gap, and the second contact plug electrically connects with the second source/drain regions disposed outside the stacked gate structures and the doped regions;

forming an interlayer dielectric layer on the substrate;

forming a third contact plug which connects with the first contact plug in the interlayer dielectric layer; and forming a conductive line on the interlayer dielectric layer, wherein the conductive line electrically connects with the third contact plug.

2. The method of claim 1, wherein the ion implantation process includes a tilt angle ion implantation process.

3. The method of claim 2, wherein the tilt angle for the ion implantation process is about 15 degrees to about 30 degrees.

4. The method of claim 1, wherein an angle between the bottoms and the sidewalls of the second trenches is an obtuse angle.

5. The method of claim 1, wherein the doped regions the source region and the drain region are doped with a same type of dopants.

6. The method of claim 1, wherein the first conductive type substrate includes a P-type substrate.

7. The method of claim 1, wherein the second conductive type first well region includes an N-type well region.

8. The method of claim 1, wherein the first conductive type second well region includes a P-type well region.

9. The method of claim 1, wherein the step of removing the first conductive layer includes performing back etching.

10. The method of claim 1, wherein the step of removing the first conductive layer includes performing chemical mechanical polishing.

* * * * *